(12) United States Patent
Mochizuki

(10) Patent No.: US 8,362,792 B2
(45) Date of Patent: Jan. 29, 2013

(54) MANUFACTURING METHOD OF PROBE CARD AND THE PROBE CARD

(75) Inventor: Jun Mochizuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 847 days.

(21) Appl. No.: 12/315,745

(22) Filed: Dec. 5, 2008

(65) Prior Publication Data

US 2009/0146673 A1 Jun. 11, 2009

(30) Foreign Application Priority Data

Dec. 5, 2007 (JP) ................................ 2007-314192

(51) Int. Cl.
*G01R 31/00* (2006.01)
(52) U.S. Cl. .......... 324/756.03; 324/754.03; 324/762.05
(58) Field of Classification Search .......... 324/754.01–754.14, 755.01–755.11, 324/756.01–756.07, 762.05
See application file for complete search history.

(56) References Cited

U.S. PATENT DOCUMENTS

| | | | | |
|---|---|---|---|---|
| 6,147,505 A | * | 11/2000 | Ott et al. | 324/754.15 |
| 6,215,320 B1 | * | 4/2001 | Parrish | 324/756.03 |
| 6,853,209 B1 | * | 2/2005 | Jovanovic et al. | 324/755.05 |
| 7,071,715 B2 | * | 7/2006 | Shinde et al. | 324/756.03 |
| 7,459,923 B2 | * | 12/2008 | Caldwell et al. | 324/754.18 |
| 8,134,381 B2 | * | 3/2012 | Abe et al. | 324/756.07 |
| 2004/0090223 A1 | * | 5/2004 | Yonezawa | 324/158.1 |
| 2007/0290698 A1 | * | 12/2007 | Mochizuki et al. | 324/754 |
| 2008/0258745 A1 | * | 10/2008 | Hosaka | 324/754 |

FOREIGN PATENT DOCUMENTS

JP 2002-151557 A 5/2002

* cited by examiner

*Primary Examiner* — Arleen M Vazquez
(74) *Attorney, Agent, or Firm* — Pearne & Gordon LLP

(57) ABSTRACT

A manufacturing method for probe card according to the present invention includes following processes. A film is formed on the surface of a circuit board. A connecting terminal and joint member are formed by etching the film, and the surface of the joint member is polished. An inspection contacting structure is assembled. The inspection contacting structure is moved proximity to a circuit board. The lower surface of a contactor and joint member are attached so as to contact the front end of a probe penetrating and passing through the contactor to the connecting terminal.

8 Claims, 5 Drawing Sheets

MANUFACTURING METHOD OF PROBE CARD AND THE PROBE CARD

This application claims priority under 35 U.S.C. §119 from Japanese patent application Serial No. 2007-314192, filed Dec. 5, 2007, entitled "Manufacturing Method of Probe Card", which is incorporated herein by reference in its entirety.

TECHNICAL FIELD

The present invention relates to a manufacturing method for probe card for examining electric characteristics for a test object and the probe card.

BACKGROUND OF THE INVENTION

For example, an examination for the electric characteristics of an electric circuit, such as, IC or LSI, formed on a semiconductor wafer (hereinafter referred as "wafer") is performed using a probe card. The prove card has a contactor supporting a plurality of probes, and a circuit board electrically connected to the contactor. Between the contactor and circuit board, a supporting member for supporting the contactor is provided. On the surface on the contactor side of the circuit board, a connecting terminal for communicating an electronic signal between the probe and the circuit board is provided. And the examination of the electric characteristics of the electric circuit on the wafer is performed by contacting the plurality of probes onto electrodes of the electric circuit and applying an electronic signal to the electrodes from each probe through the circuit board with a printed circuit. (Japanese Unexamined Patent Application Publication No. 2002-151557).

When manufacturing such a probe card, normally, an inspection contacting structure 104, which is also called a probe head, having a contactor 102 supporting a plurality of probes 101 and a supporting member 103 have been assembled in advance as shown in FIG. 7. Further, on a surface of a circuit board 105, a connecting terminal 106 is formed, for example, by etching a film formed on the surface. A probe card 110 is then manufactured by attaching the supporting member 103 of the inspection contacting structure 104 to the surface of the circuit board 105 in which the connecting terminal 106 is formed.

By the way, there may be a case where an organic substrate, such as a glass epoxy substrate, is used as the circuit board 105 along with the increase in the wafer size in recent years. For example, the glass epoxy substrate is normally formed by stacking a plurality of glass epoxy layers and pressure bonding them, thereby a large sized circuit board can be formed. However, in the glass epoxy substrate, the flatness of its surface may be decreased because an adhesive agent used to bond each layer has significant effect in the variation in rate of remaining copper in each layer. For example, even in a case when the flatness is increased by controlling the adhesive agent or rate of remaining in copper in each layer, the flatness is about 50 μm. Thus, the circuit board 105 and the inspection contacting substrate 104 are not attached properly, which resulting in the variation of the height of the probe 101, and the examination of the electric characteristics of the electric circuit on the wafer can not be performed properly.

Further, when attempting to polish this surface to flatten the surface of the circuit board 105, the connecting terminal 106 formed on the surface of the circuit board 105 is also shaved off. Therefore, the surface of the circuit board 105 has not been able to be polished.

The present invention has been made considering above issues, and an objective is to improve the flatness of a circuit board for performing an inspection of the electric characteristics of a test object properly even in a case when an organic substrate is used as the circuit board for a probe card.

SUMMARY OF THE INVENTION

In accordance with a first aspect of the invention, a manufacturing method for a probe card having a contacting body and a circuit substrate includes the steps of:
preparing the contacting body having a probe for contacting a test object;
forming a connecting terminal and a joint member on the circuit substrate, the connecting terminal communicating an electric signal with the probe;
polishing a surface of the joint member; and
joining the joint member to the contacting body.

According to the first aspect of the present invention, the joint member is formed on the surface of the circuit substrate and the joint member is polished before joining the circuit substrate and the contacting body. Therefore, the flatness of the circuit substrate can be improved by flattening the surface of the joint member even in a case when, for example, an organic substrate is used as a circuit substrate.

In accordance with a second aspect of the invention, a manufacturing method for a probe card having a first structure and a second structure for testing a test object including the steps of
forming a film on the first structure;
etching the film thereby forming a connecting terminal and a joint member on the first structure; and
attaching the joint member to the second structure, the second structure having a probe for contacting the test object, and the probe being electrically connected to the connecting terminal.

According to the second aspect of the present invention, the connecting terminal and the joint member are formed by forming a film on the first structure and then etching the film. Therefore, the connecting terminal and the joint member can be formed on the surface of the first structure simultaneously. That is, the probe card can be easily manufactured at a low cost because it is not necessary to form the connecting terminal and the joint member separately.

In accordance with a third aspect of the invention, a probe card for testing a test object includes:
a circuit substrate;
a terminal that is located on the circuit substrate;
a joint member that is located on the circuit substrate;
a contacting body that is located on the joint member, the contacting body having a probe for contacting the test object; and
a metal film located between the joint member and the contacting body;
wherein the contacting body is distanced from a surface of the terminal.

According to the third aspect of the present invention, the contacting body is distanced from the terminal. Therefore, a favorable probe card can be provided in a case when a space is required between the terminal and the contacting body. For example, this is especially favorable when a via hole is formed on the surface of the terminal.

According to the present invention, the flatness of the circuit board can be improved even when an organic substrate is used in a circuit board for the probe card.

BRIEF DESCRIPTION OF THE DRAWINGS

FIG. 3(a) illustrates a condition where a film is formed on a circuit board.

FIG. 3(b) illustrates a condition where a connecting terminal and joint member are formed on a surface of a circuit board.

FIG. 3(c) illustrates a condition where an inspecting contacting structure is moved proximately to a circuit board.

FIG. 3(d) illustrates a condition where a lower face of a contactor and joint member are connected.

FIG. 6(a) illustrates a condition where a connecting terminal and joint member are formed on a circuit board.

FIG. 6(b) illustrates a condition where a mask is formed on a connecting terminal so as to expose a surface of a joint member.

FIG. 6(c) illustrates a condition where the surface of a joint member is plated with a metal.

FIG. 6(d) illustrates a condition where a metal film is formed on the surface of a joint member after removing the mask.

DETAILED DESCRIPTION OF INVENTION

Figure 1:
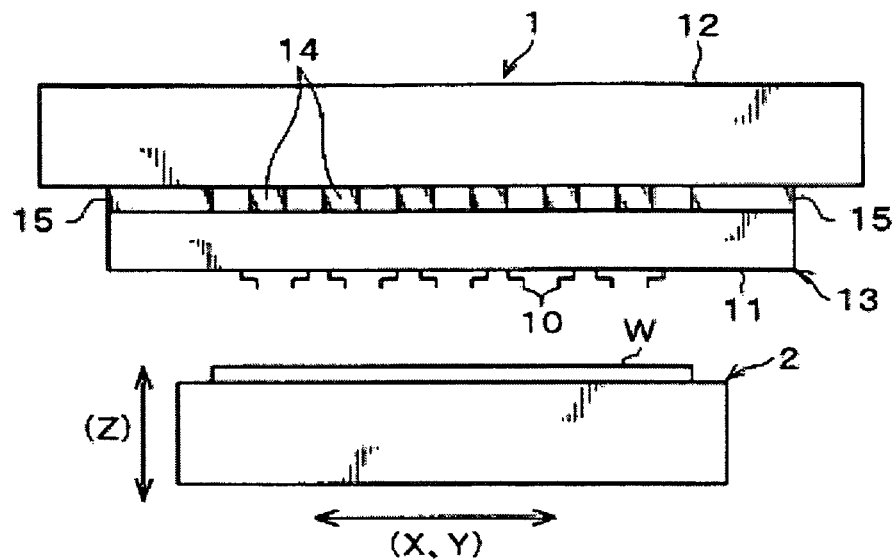
FIG. 1 is a side view illustrating an outline of a configuration of a probe card manufactured by a method pertaining to an embodiment, and a condition of use of the probe card.

Preferred embodiments of the present invention will hereinafter be explained. FIG. 1 is a side view illustrating an outline of a configuration of a probe card 1 manufactured by a method pertaining to the embodiment and a mode in using the probe card 1. The probe card 1 inspects the electric characteristics of an electric circuit of a wafer W as a test object placed on a table 2.

The entire probe card 1 is, for example, formed in a substantial disk shape. The probe card 1 is provided with a contactor 11 supporting a plurality of probes 10 contacting the electrodes of the wafer W and a circuit board 12, which sends and receives an electronic signal to or from the probe 10 via contactor 11.

The contactor 11 is formed, for example, in a substantially rectangular plate and arranged on the lower face side of the probe card 1 so as to face against the table 2. Onto the lower surface of the contactor 11, a plurality of probes 10 that are arranged to correspond a plurality of electrodes (not shown) on the wafer W, are supported. The probes 10 are penetrating the contactor 11 in the thickness direction. In addition, a contacting body for inspection 13 is formed from the probes 10 and the contactor 11.

The circuit board 12 is formed, for example, in a substantial disk shape, and is arranged facing to the contactor 11 so as to be positioned parallel to the contactor 11. Onto the lower surface of the circuit board 12, provided is a connecting terminal 14 to electrically conduct to the rear end of the probe 10 which penetrates the contactor 11 in the thickness direction. An electric circuit for sending and receiving an electric signal between a test head (not shown) and the contactor 11 is formed inside of the circuit board 12. In addition, an organic substrate, such as, a glass epoxy substrate, is used for the circuit board 12. Further, as a material of the connecting terminal 14, for example, Cu, Ni, Pd is used.

Figure 2:
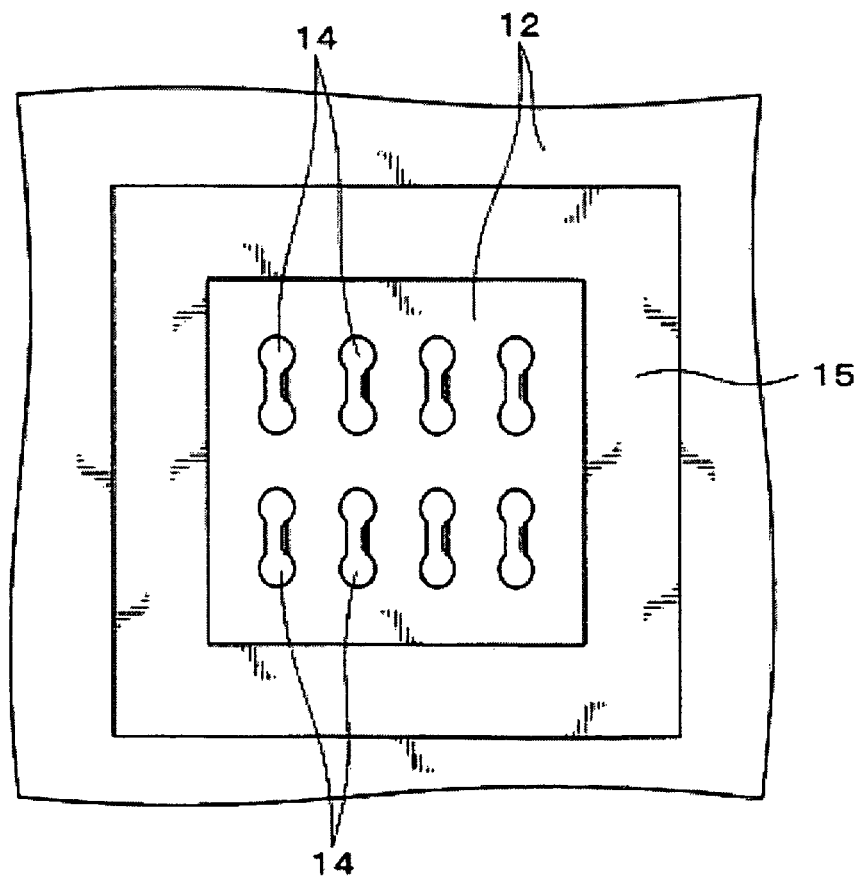
FIG. 2 is a plane view of a circuit board pertaining to an embodiment.

On the lower surface of the circuit board 12, that is, the surface where the connecting terminal 14 is provided, a joint member 15 is provided to connect the circuit board 12 and the contactor 11. The joint member 15 is formed in the same height as the connecting terminal 14 and the surface of the joint member 15 on the contactor 11 side is polished to be flat. As shown in FIG. 2, the joint member 15 is formed so as to surround the plurality of connecting terminals 14 on the outer circumference on the area facing to the lower surface of the contactor 11, for example. In addition, as a material of the joint member 15, the same material as the connecting terminal 14, such as, Cu, Ni, or Pd, is used.

As shown in FIG. 1, the table 2 is movable in a horizontal X-Y direction and vertical direction (Z direction), and moves the placed wafer W three-dimensionally, thereby the probe 10 of the probe card 1 can be contacted to a desired position on the wafer W.

First, the wafer W is placed on the table 2 when inspecting the electric characteristics of the electric circuit of the wafer W using the probe card 1 configured as described above. Next, for example, the table 2 is moved so that the wafer W is moved closer to the contactor 11 and each of the predetermined electrodes on the wafer W is contacted to each probe 10. The electric signal for inspection is then communicated to the wafer W via the circuit board 12, connecting terminal 14, contactor 11 and probe 10, and the electric characteristics of the electric circuit of the wafer W is inspected.

Next, a manufacturing method of the probe card 1 pertaining to the embodiment will be explained with reference to FIGS. 3A to 3D.

Figure 3:
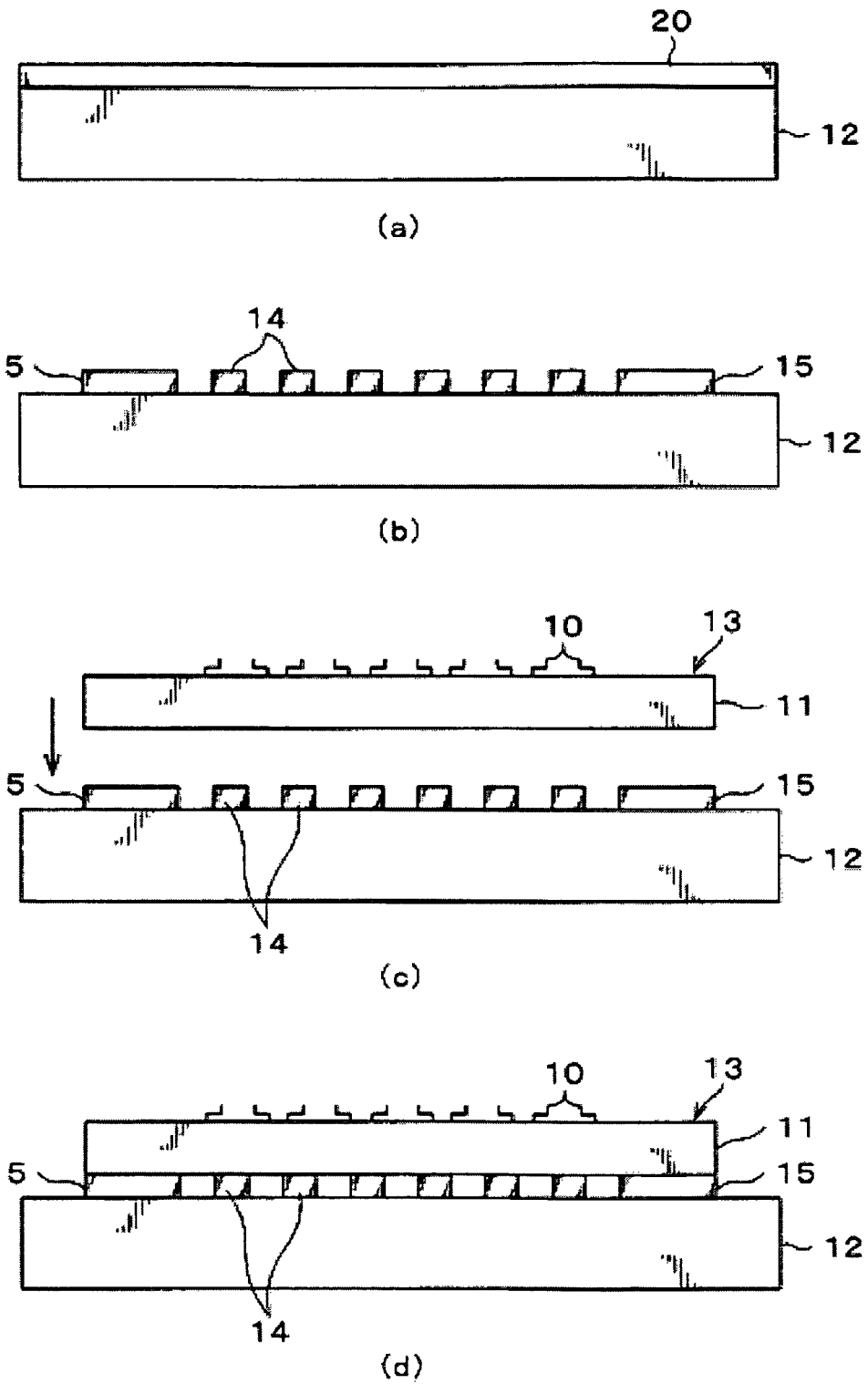
FIGS. 3(a) to 3(d) are flows showing a manufacturing method of a probe card pertaining to an embodiment.

First, a film 20 of Cu, Ni or Pd etc. is formed on the surface of the circuit board 12 (FIG. 3(a)). Next, the film 20 is etched and the connecting terminal 14 and joint member 15 are formed. Thereafter, the surface (upper face side in the figure) on the opposite side from the circuit board 12 on the joint member 15 is polished. For this polish of the surface of the joint member 15, for example, a CMP (Chemical Mechanical Polishing) method, in which an abrasive is applied on a surface and polished, is used. And the connecting terminal 14 and joint member 15 are formed in the same heights (FIG. 3(b)).

In this way, the connecting terminal 14 and joint member 15 are formed on the surface of the circuit board 12, and meanwhile the contacting body for inspection 13 is assembled by penetrating the probe 10 so as to pass through a predetermined position of the contactor 11. And the contacting body for inspection 13 is moved proximately to the circuit board 12 (FIG. 3(c)). Thereafter, the lower surface of the contactor 11 and the joint member 15 on the circuit board 12 are joined with, for example, an adhesive agent so as to contact the lower surface of the contactor 11 to the connecting terminal 14, that is, the rear end of the probe 10 penetrating and passing through the contactor 11 contacts the connecting terminal 14 on the circuit board 12 (FIG. 3(d)). In addition, the lower face of the contactor 11 and the joint member 15 may be joined by a screw or leaf spring.

According to the embodiment described above, the flatness of the circuit board 12 can be improved even in a case when a glass epoxy substrate is used as the circuit board 12, because the joint member 15 is formed on the surface of the circuit board 12 so as to surround the connecting terminal 14 before connecting the circuit board 12 and contacting body for inspection 13, and thereafter this joint member 15 is polished. In this way, because the surface of the joint member 15, which is a contact surface to the contacting body for inspection 13, can be flattened, the contacting body for inspection 13 can easily and properly be contacted to the circuit board 12, thereby the plurality of probes 10 supported by the contactor 11 can be arranged in a predetermined height. Therefore, the probe can be contacted properly to the electrode on the wafer W and the inspection can be performed properly when the electric characteristics of the electric circuit on the wafer W is inspected.

Further, because the film 20 is formed on the circuit board 12 and this film 20 is etched, the connecting terminal 14 and joint member 15 can be formed on the surface of the circuit board 12 at the same time. Therefore, there is no need to provide a supporting member between the contactor and circuit board as in a conventional technique, thus the probe card 1 can be manufactured easily at a low cost.

Figure 4:
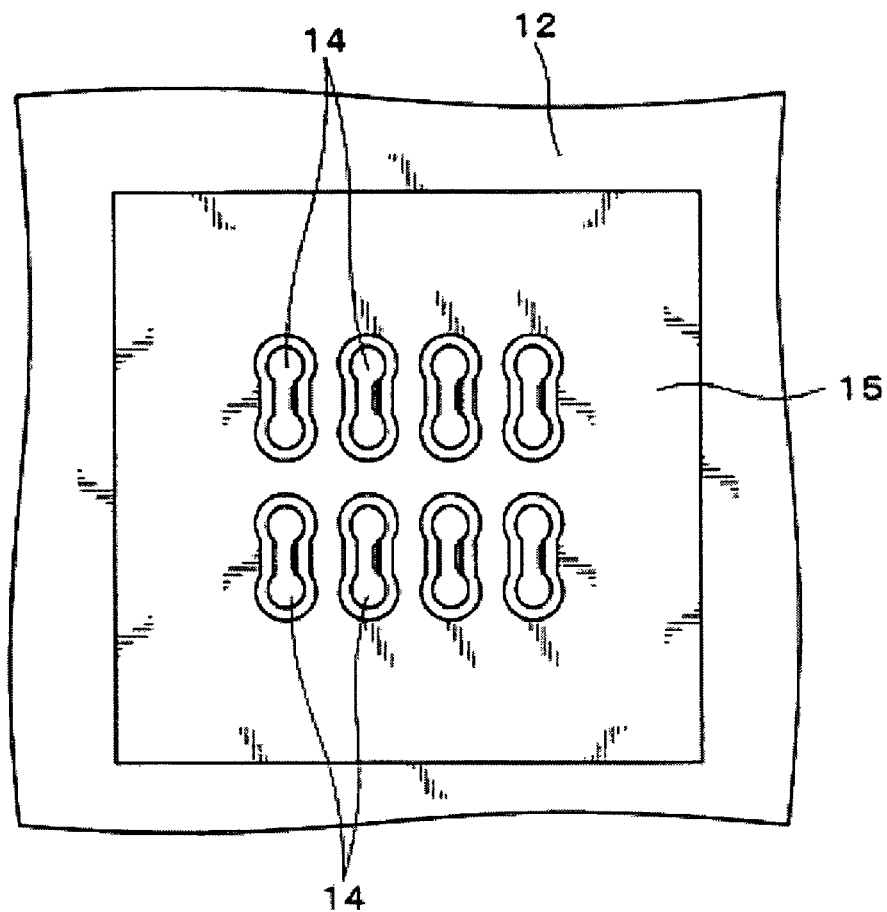
FIG. 4 is a plane view of a circuit board pertaining to another embodiment.

In the embodiment described above, the joint member 15 is formed on the outer circumference of the area facing to the lower surface of the contactor 11 so as to surround the plurality of connecting terminals 14. However, the joint member 15 may be formed such that the substantially entire area other than the connecting terminals 14 is covered as shown in FIG. 4. This improves the adhesiveness of the contactor 11 and joint member 15, thereby the contacting body for inspection 13 can be stably contacted to the circuit board 12.

Figure 5:
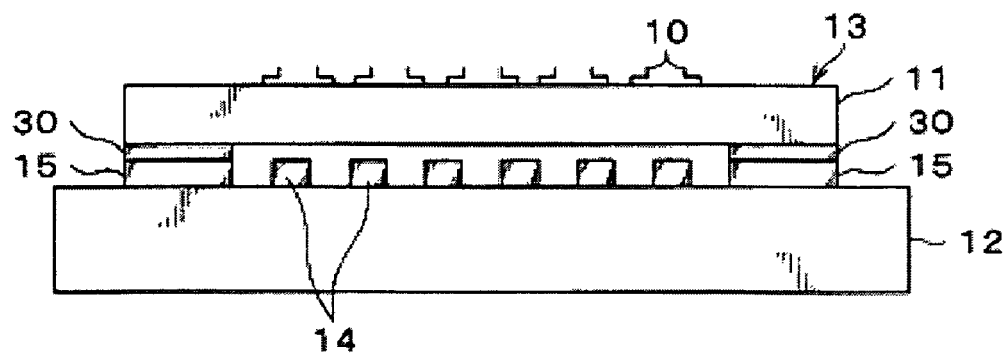
FIG. 5 is a side view illustrating an outline of a configuration of a probe card pertaining to another embodiment.
Figure 6:
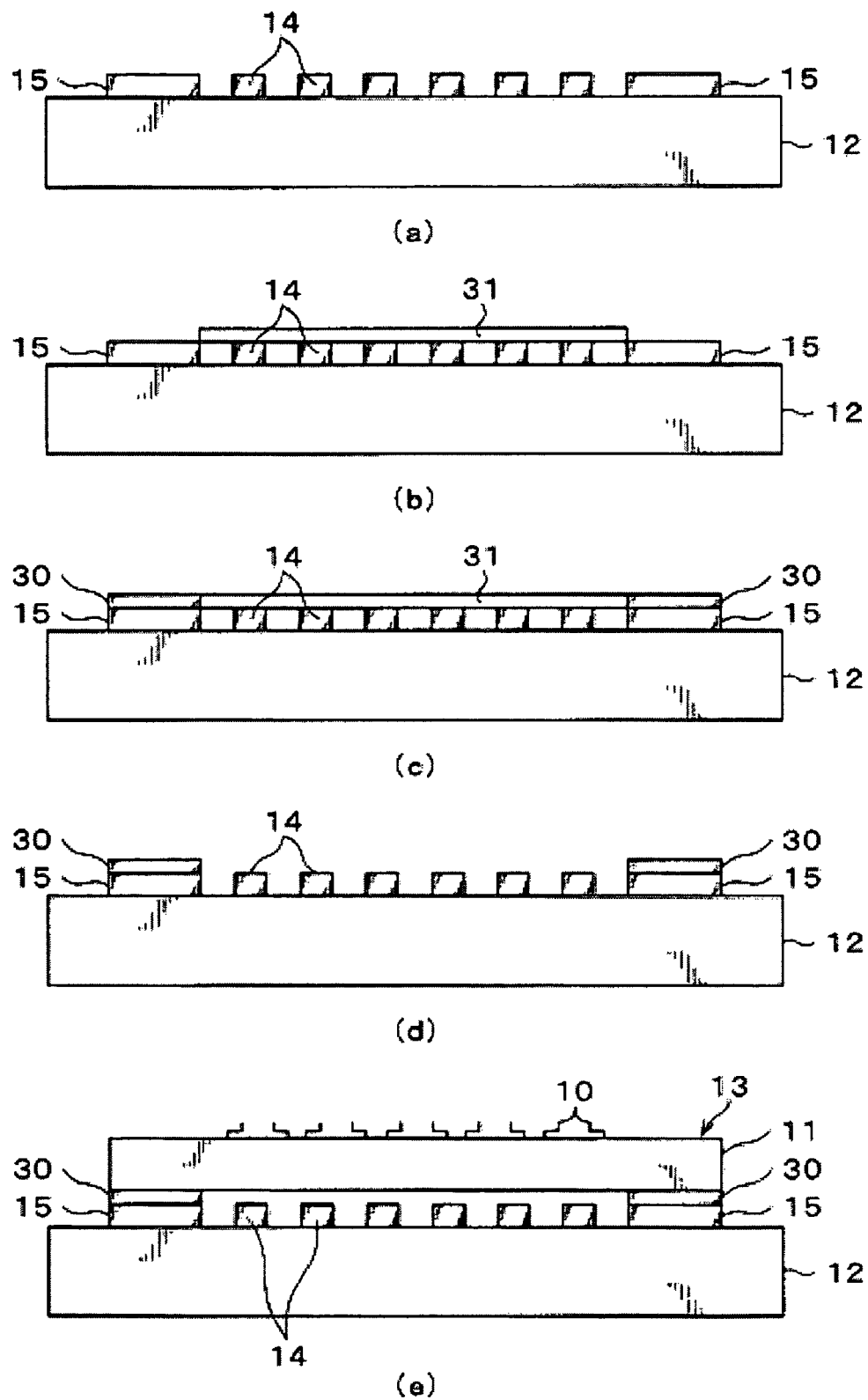
FIGS. 6(a) to 6(d) are flows illustrating a manufacturing method of a probe card pertaining to another embodiment.
FIG. 6(e) illustrates a condition where the lower face of a contactor and metal film are attached.
Figure 7:
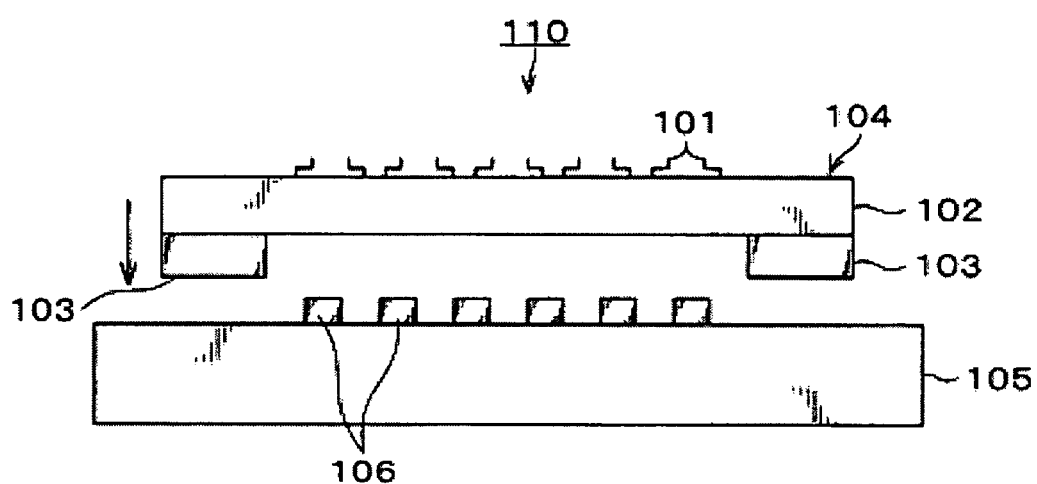
FIG. 7 is a diagram explaining a conventional manufacturing method of a probe card.

In the embodiments described above, the lower surface of the contactor 11 is contacted to the joint member 15 on the circuit board 12. However, a metal film 30 and the lower surface of the contactor 11 may be contacted after forming the metal film 30 on the joint member 15 as shown in FIG. 5.

A forming method of this metal film 30 will be hereinafter explained with reference to FIGS. 6(a) to 6(e). First, the connecting terminal 14 and joint member 15 are formed on the surface of the circuit board 12 with the same method as the embodiment described above (FIG. 6(a)). Next, a mask 31 is formed on the connecting terminal 14 so as to expose the surface of the joint member 15 (FIG. 6(b)). And a metal is plated on the surface of the joint member 15 to form the metal film 30 (FIG. 6(c)). Thereafter, the mask 31 is removed (FIG. 6(d)), and the lower face of the contactor 11 of the contacting body for inspection 13 is joined to the metal film 30 with, for example, an adhesive agent (FIG. 6(e)).

In such a case, because the height of the surface of the metal film 30 is higher than the height of the surface of the connecting terminal 14, a space can be formed between the connecting terminal 14 and the lower surface of the contactor 11. Further, because the metal plating capable of adjusting the film thickness in a unit of a few μm is performed on the surface of the joint member 15 that are polished and flattened, the surface of the formed metal film 30 can be flattened and a predetermined space can be formed between the connecting terminal 14 and the lower surface of the contactor 11. In this way, the present invention can be applied even in a case when a space is needed between the connecting terminal 14 and the contactor 11, such as, when a via (via hole) is formed on the surface of the connecting terminal 14, for example. Further, because a metal is plated on the surface of the joint member 15 by using the mask 31, portions other than the joint member 15 are not plated with the metal, thus, the metal film 30 can be formed with a high accuracy.

The preferred embodiments of the present invention have been explained with reference to the attached figures. Needless to say, the present invention is not limited to those embodiments. It is obvious that one skilled in the art can easily make various changes and modifications within the scope of the claims and it is also understood that those changes and modifications fall within the technical scope of the present invention. The present invention is not limited to this example and various aspects may be made.

For example, the materials for a connecting terminal, a contact member, film or circuit board are examples, and change can be arbitrarily made. Further, a polishing method other than CMP may be used as a polishing method of the joint member. In addition, the metal film may be formed by a method other than plating.

The present invention is useful for a probe card for inspecting electric characteristics of a test object, such as a semiconductor wafer.

What is claimed is:

1. A probe card for testing a test object comprising:
    a circuit substrate;
    a connecting terminal formed on a surface of the circuit substrate, wherein the connecting terminal comprises a plurality of terminals;
    a contacting body having a plurality of probes for contacting the test object;
    a joint member for connecting the circuit substrate to the contacting body, wherein the joint member is formed on the surface of the circuit substrate so as to surround the plurality of terminals on an outer circumference area facing the contacting body; and
    a metal film positioned between the joint member and the contacting body such that the contacting body is distanced from the connecting terminal on its outer circumference area.

2. The probe card of claim 1, wherein the circuit substrate is an organic substrate.

3. The probe card of claim 1, wherein the circuit substrate is formed by a glass epoxy.

4. The probe card of claim 1, wherein the connecting terminal contains copper (Cu), nickel (Ni) or palladium (Pd).

5. The probe card of claim 1, wherein the joint member contains copper (Cu), nickel (Ni) or palladium (Pd).

6. The probe card of claim 1, wherein the connecting terminal and the joint member are formed of the same material.

7. The probe card of claim 1, wherein the connecting terminal and the joint member are formed equal in height.

8. The probe card of claim 1, wherein a thickness of the metal film is a few μm.

* * * * *